United States Patent
Blanchard

(10) Patent No.: US 6,432,775 B2
(45) Date of Patent: Aug. 13, 2002

(54) TRENCH DMOS TRANSISTOR STRUCTURE HAVING A LOW RESISTANCE PATH TO A DRAIN CONTACT LOCATED ON AN UPPER SURFACE

(75) Inventor: Richard A. Blanchard, Los Altos, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/873,984

(22) Filed: Jun. 1, 2001

Related U.S. Application Data

(62) Division of application No. 09/516,285, filed on Mar. 1, 2000.
(60) Provisional application No. 60/122,762, filed on Mar. 1, 1999.

(51) Int. Cl.$^7$ ............................................. H01L 21/336
(52) U.S. Cl. ..................... 438/270; 438/268; 438/269; 438/272; 438/273; 438/274; 257/330; 257/336
(58) Field of Search ................................. 438/268, 269, 438/270, 272, 273, 274; 257/330, 336

(56) References Cited

U.S. PATENT DOCUMENTS 5,877,528 A * 3/1999 So ............................. 257/341

* cited by examiner

*Primary Examiner*—Wael Fahmy
*Assistant Examiner*—Hsien-Ming Lee
(74) *Attorney, Agent, or Firm*—Mayer Fortkort & Williams, PC; Stuart H. Mayer, Esq.; Karin L. Williams, Esq.

(57) ABSTRACT

A semiconductor device includes a first region of semiconductor material, which is doped to a first concentration with a dopant of a first conductivity type. A gate trench formed within the first region has sides and a bottom. A drain access trench is also formed within the first region, which also has sides and a bottom. A second region of semiconductor material is located within the first region and adjacent to and near the bottom of the gate trench. The second region extends to a location adjacent to and near the bottom of the drain access trench. The second region is of the first conductivity type and has a higher dopant concentration than the first region. A gate electrode is formed within the gate trench. A layer of gate dielectric material insulates the gate electrode from the first and second regions. A drain region of semiconductor material is located within the drain access trench. The drain region is of a first conductivity type and has a higher dopant concentration than the first region. A source region is formed on the surface of the first semiconductor region and a body region is formed within the first region beneath the source region. The body region has a second conductivity type opposite to the first conductivity type.

10 Claims, 9 Drawing Sheets

TRENCH DMOS TRANSISTOR STRUCTURE HAVING A LOW RESISTANCE PATH TO A DRAIN CONTACT LOCATED ON AN UPPER SURFACE

STATEMENT OF RELATED APPLICATION

This application is a divisional of co-pending U.S. patent application No. 09/516,285, filed Mar. 1, 2000, entitled "Trench DMOS Transistor Structure having A Low Resistance Path to a Drain Contact Located on an Upper Surface", which claims the benefit of prior filed U.S. Provisional Pat. App. Ser. No. 60/122,762, filed Mar. 1, 1999.

FIELD OF THE INVENTION

The present invention relates generally to MOSFET transistors and more generally to DMOS transistors having a trench structure.

BACKGROUND OF THE INVENTION

DMOS (Double diffused MOS) transistors are a type of MOSFET (Metal On Semiconductor Field Effect Transistor) that use two sequential diffusion steps aligned to the same edge to form the transistor regions. DMOS transistors are typically employed as power transistors to provide high voltage, high current devices for power integrated circuit applications. DMOS transistors provide higher current per unit area when low forward voltage drops are required.

A typical discrete DMOS circuit includes two or more individual DMOS transistor cells which are fabricated in parallel. The individual DMOS transistor cells share a common drain contact (the substrate), while their sources are all shorted together with metal and their gates are shorted together by polysilicon. Thus, even though the discrete DMOS circuit is constructed from a matrix of smaller transistors, it behaves as if it were a single large transistor. For a discrete DMOS circuit it is desirable to maximize the conductivity per unit area when the transistor matrix is turned on by the gate.

One particular type of DMOS transistor is a so-called trench DMOS transistor in which the channel is formed vertically and the gate is formed in a trench extending between the source and drain. The trench, which is lined with a thin oxide layer and filled with polysilicon, allows less constricted current flow and thereby provides lower values of specific on-resistance. Examples of trench DMOS transistors are disclosed in U.S. Pat. Nos. 5,072,266, 5,541, 425, and 5,866,931.

One example is the low voltage prior art trenched DMOS transistor shown in the cross-sectional view of FIG. 1. As shown in FIG. 1, trenched DMOS transistor 10 includes heavily doped substrate 11, upon which is formed an epitaxial layer 12, which is more lightly doped than substrate 11. Metallic layer 13 is formed on the bottom of substrate 11, allowing an electrical contact 14 to be made to substrate 11. As is known to those of ordinary skill in the art, DMOS transistors also include source regions 16a, 16b, 16c, and 16d, and body regions 15a and 15b. Epitaxial region 12 serves as the drain. In the example shown in FIG. 1, substrate 11 is relatively highly doped with N-type dopants, epitaxial layer 12 is relatively lightly doped with N type dopants, source regions 16a, 16b, 16c, and 16d are relatively highly doped with N type dopants, and body regions 15a and 15b are relatively highly doped with P type dopants. Doped polycrystalline silicon 18 is formed within a trench, and is electrically insulated from other regions by gate dielectric layer 17 formed on the bottom and sides of the trench. The trench extends into the heavily doped substrate 11 to reduce any resistance caused by the flow of carriers through the lightly doped epitaxial layer 12, but this structure also limits the drain-to-source breakdown voltage of the transistor. A drain electrode 14 is connected to the back surface of the substrate 11, a source electrode 22 is connected to the source regions 16 and the body regions 15 through metallic contact layer 20, and a gate electrode 19 is connected to the polysilicon 18 that fills the trench.

Another example of a trenched DMOS device is disclosed in U.S. Pat. No. 4,893,160 and shown in the cross-sectional view of FIG. 2. As shown in FIG. 2, trenched DMOS device 30 includes metallic substrate electrode 13, substrate 11, epitaxial region 12, body regions 15a and 15b, source regions 16a, 16b, 16c, and 16d, photoresist layer 35, trench extension 38 and gate oxide 40. However, in comparison to the device shown in FIG. 1, N+region 39 is added along the lower sides and bottom of trench 36, or alternatively just along the bottom of trench 36. This structure improves the device performance by allowing carriers to flow through a heavily doped region at the bottom of the trench, thereby reducing the local resistance.

SUMMARY OF THE INVENTION

In accordance with the present invention, a semiconductor device includes a first region of semiconductor material, which is doped to a first concentration with a dopant of a first conductivity type. A gate trench formed within the first region has sides and a bottom. A drain access trench is also formed within the first region, which also has sides and a bottom. A second region of semiconductor material is located within the first region and adjacent to and near the bottom of the gate trench. The second region extends to a location adjacent to and near the bottom of the drain access trench. The second region is of the first conductivity type and has a higher dopant concentration than the first region. A gate electrode is formed within the gate trench. A layer of gate dielectric material insulates the gate electrode from the first and second regions. A drain region of semiconductor material is located within the drain access trench. The drain region is of a first conductivity type and has a higher dopant concentration than the first region. A source region is formed on the surface of the first semiconductor region and a body region is formed within the first region beneath the source region. The body region has a second conductivity type opposite to the first conductivity type.

DETAILED DESCRIPTION

Figure 1:
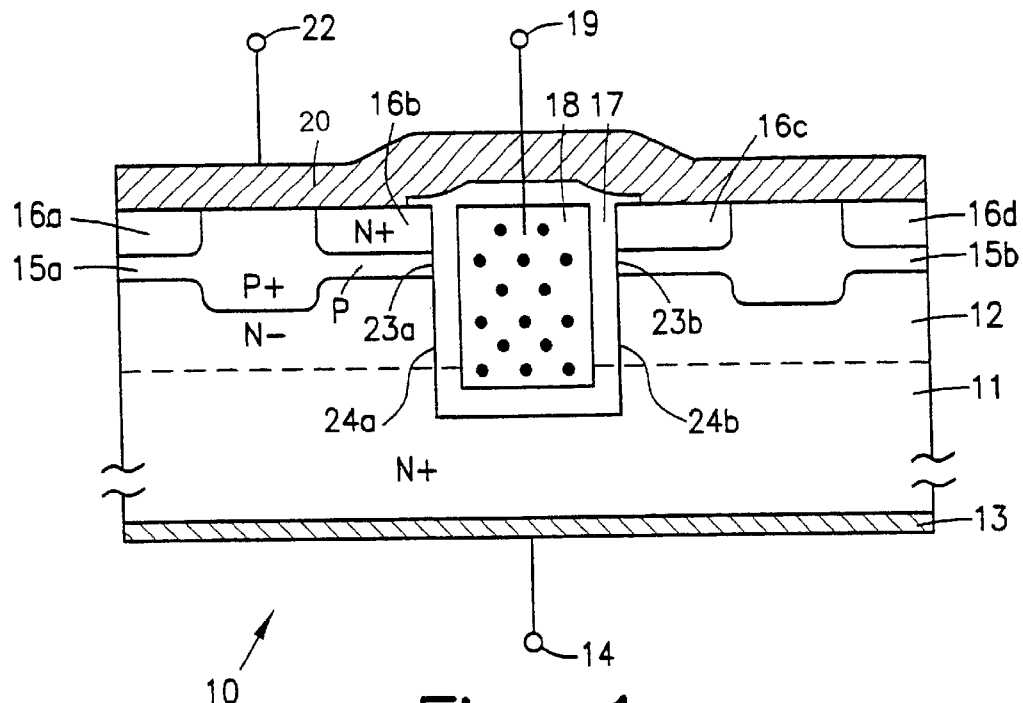
FIGS. 1 and 2 each show cross-sectional views of a conventional DMOS transistor.
Figure 2:
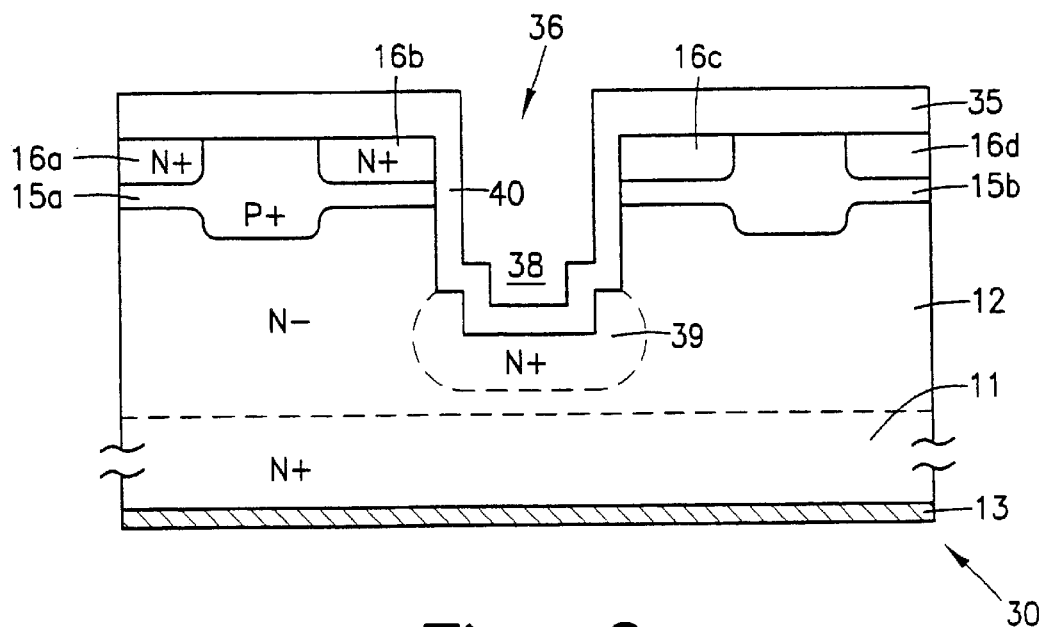
Figure 3:
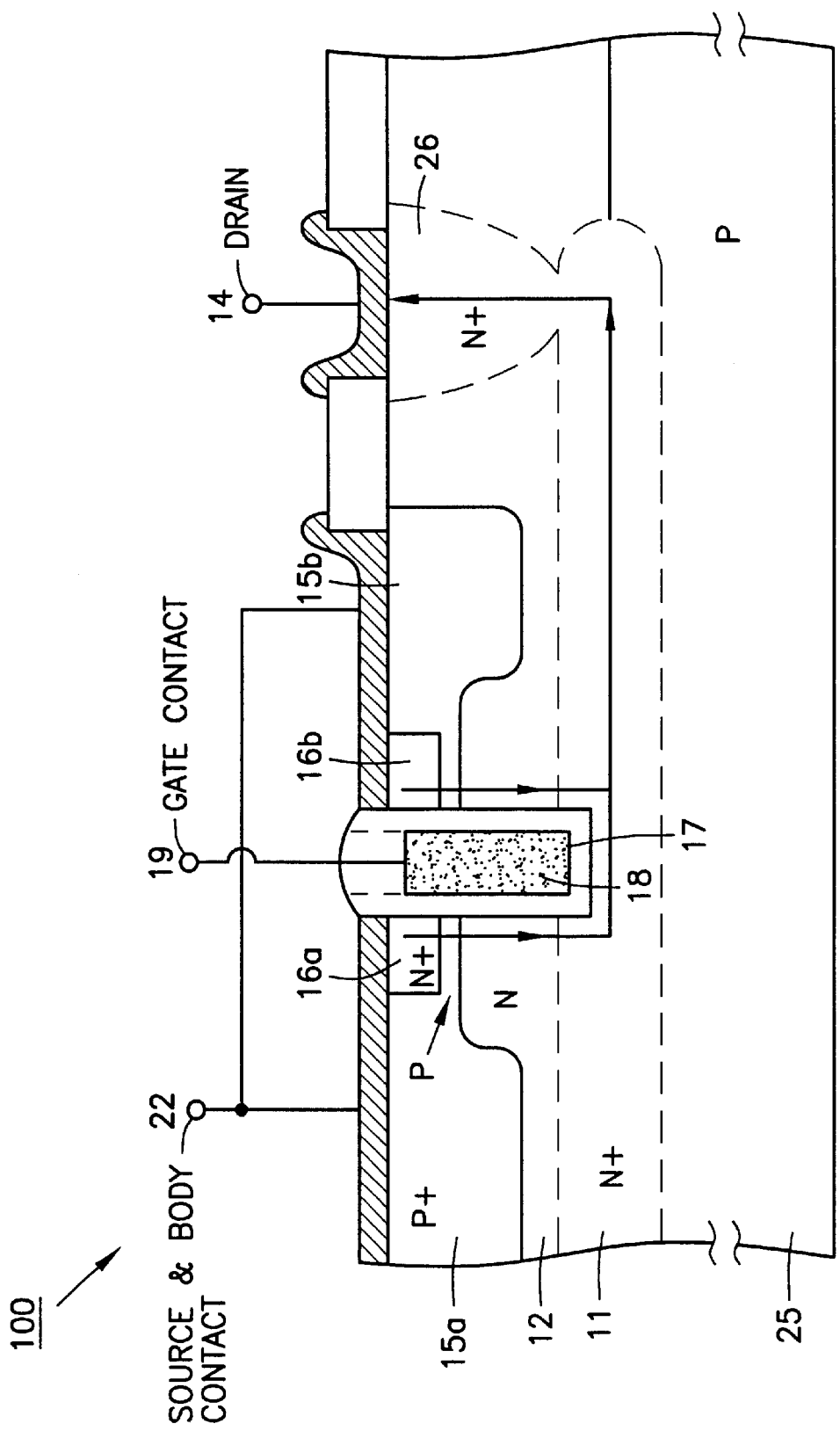
FIG. 3 shows a cross-sectional view of one embodiment of the DMOS transistor constructed in accordance with the present invention.

FIG. 3 shows one embodiment of a trench DMOS transistor 100 constructed in accordance with the present invention. One notable advantage of this structure is that because it is self-isolated it can be used not only in discrete components but also in integrated circuits As shown in FIG. 3, trench DMOS transistor 100 includes a substrate 25, heavily doped buried layer 11, and an epitaxial layer 12, which is more lightly doped than buried layer 11. While the substrate 25 may be N-type or P-type, a P-type substrate will be preferred when the structure is to be incorporated into an integrated circuit. The DMOS transistor also includes source regions 16a and 16b and body regions 15a and 15b. As is well known to those of ordinary skill in the art, the body regions will typically include a deeper more heavily doped region and a shallower, more lightly doped region. In the example shown in FIG. 3, buried layer 11 is relatively highly doped with N type dopants, epitaxial layer 12 is relatively lightly doped with N type dopants, source regions 16a and 16b relatively highly doped with N type dopants, and body regions 15a and 15b include portions that are relatively highly doped and relatively lightly doped with P type dopants. A polycrystalline silicon gate electrode 18, which is formed within a trench, is electrically insulated from other regions by a gate dielectric layer 17 formed on the bottom and sides of the trench containing gate electrode 18. The trench extends into the heavily doped buried layer 11. In contrast to the conventional structures shown in FIGS. 1 and 2, in this device the drain is located on the top surface rather than the back surface of the structure. More specifically, a drain access region 26 extends from the top surface of the device to the heavily doped buried layer 11. The drain access region 26 is heavily doped and of the same conductivity type as the buried layer 11. The drain access region provides a low resistance path from the heavily doped buried layer 11 to a drain electrode 14. Finally, similar to the devices shown in FIGS. 1 and 2, a source electrode 22 is connected to the source regions 16 and the body regions 15, and a gate electrode 19 is connected to the polysilicon 18 that fills the trench.

Figure 4:
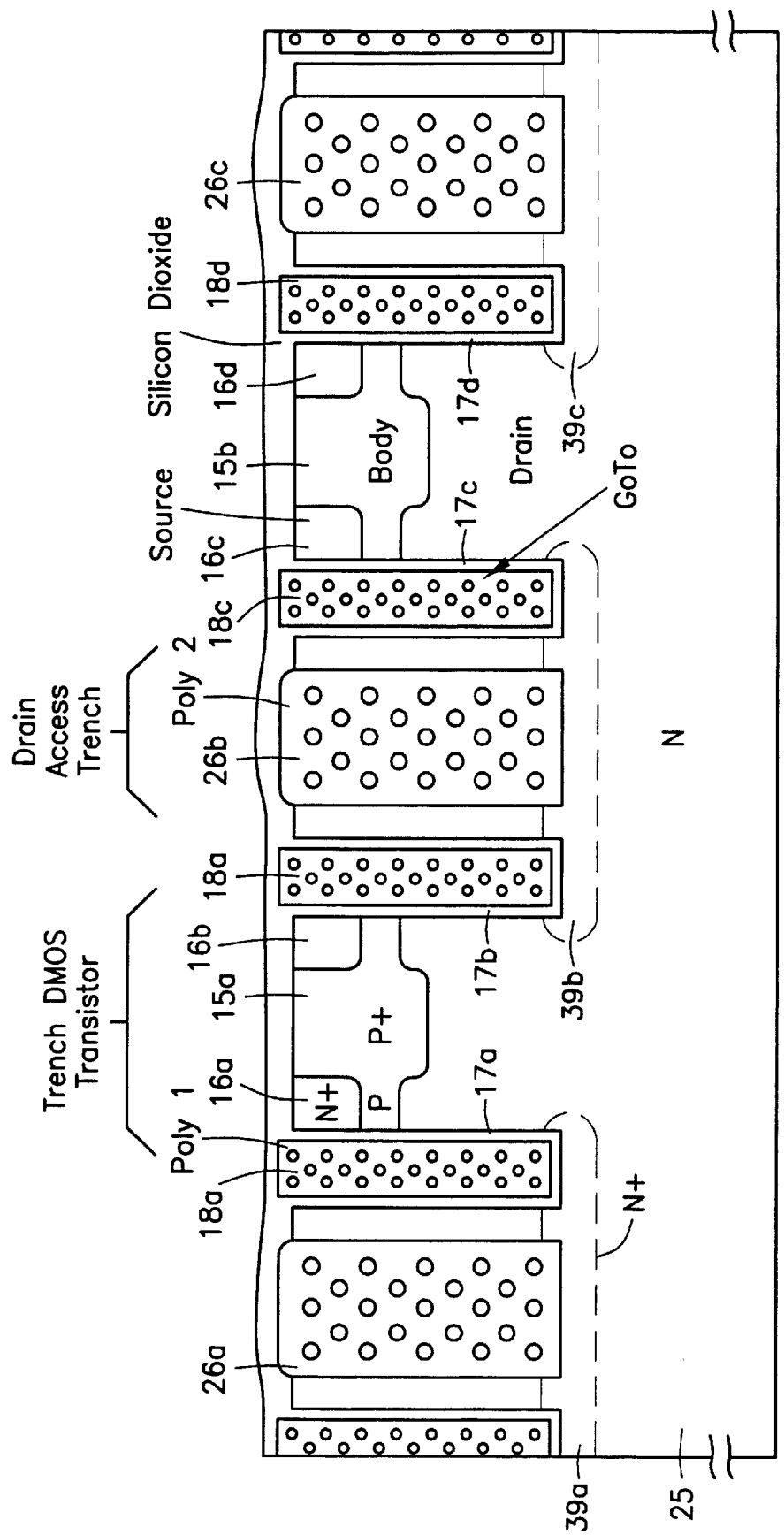
FIG. 4 shows an alternative embodiment of the DMOS transistor constructed in accordance with the present invention.

One problem with the device structure shown in FIG. 3 is that it can be relatively expensive to manufacture because it requires the deposition of an epitaxial layer, i.e., epitaxial buried layer 11, which is inherently expensive to produce. In another embodiment of the present invention, depicted in FIG. 4 as an integrated circuit having a plurality of DMC)S transistors, the epitaxial buried layer 11 is eliminated so that fabrication of the device is considerably simplified. As shown in FIG. 4, trench DMOS transistor 100 includes a substrate 25 in which the device is formed. Similar to the previously depicted structures, the DMOS transistor shown in FIG. 4 includes source regions 16a, 16b, 16c and 16d and body regions 15a and 15b. In the example shown in FIG. 4, substrate 25 is doped with N-type dopants (although alternatively, P-type dopants may be used), source regions 16a, 16b, 16c, and 16d are relatively highly doped with N type dopants, and body regions 15a and 15b are relatively highly doped with P type dopants. Polycrystalline silicon gate electrodes 18a, 18b, and 18c are each formed within a gate trench. The gate electrodes 18a, 18b, and 18c are electrically insulated from other regions by gate dielectric layers 17a, 17b, and 17c formed on the bottom and sides of each respective gate trench. Additional trenches defining drain access regions 26a, 26b, and 26c also extend from the top surface of the device.

A low resistance path for the drain is provided by adding heavily doped regions along the lower sides and bottom of the gate trenches and the drain access trenches, or alternatively, only along the bottom of the gate trenches and drain access trenches. The heavily doped regions merge laterally, forming a continuous, heavily doped region 39 that extends from the bottom of each gate trench to its associated drain access trench. The drain access region 26 is heavily doped with the same conductivity type dopant as heavily doped region 39. The drain access region 26 provides a low resistance path from the heavily doped region 39 to the drain electrode 14 located on the top surface of the device.

As will be discussed in more detail in connection with FIG. 5, the heavily doped region 39 is formed by diffusing a species such as phosphorous through the gate trench and the drain access trench before they are filled with polysilicon. The gate and drain access trenches should be sufficiently close to one another to ensure that the dopants diffusing therethrough merge together to form the continuous, low resistance path between the trenches and the drain electrode.

As previously mentioned, the structure shown in FIG. 4 advantageously eliminates the need for a heavily doped, epitaxial buried layer such as the layer 11 shown in FIG. 3.

Figure 5A:
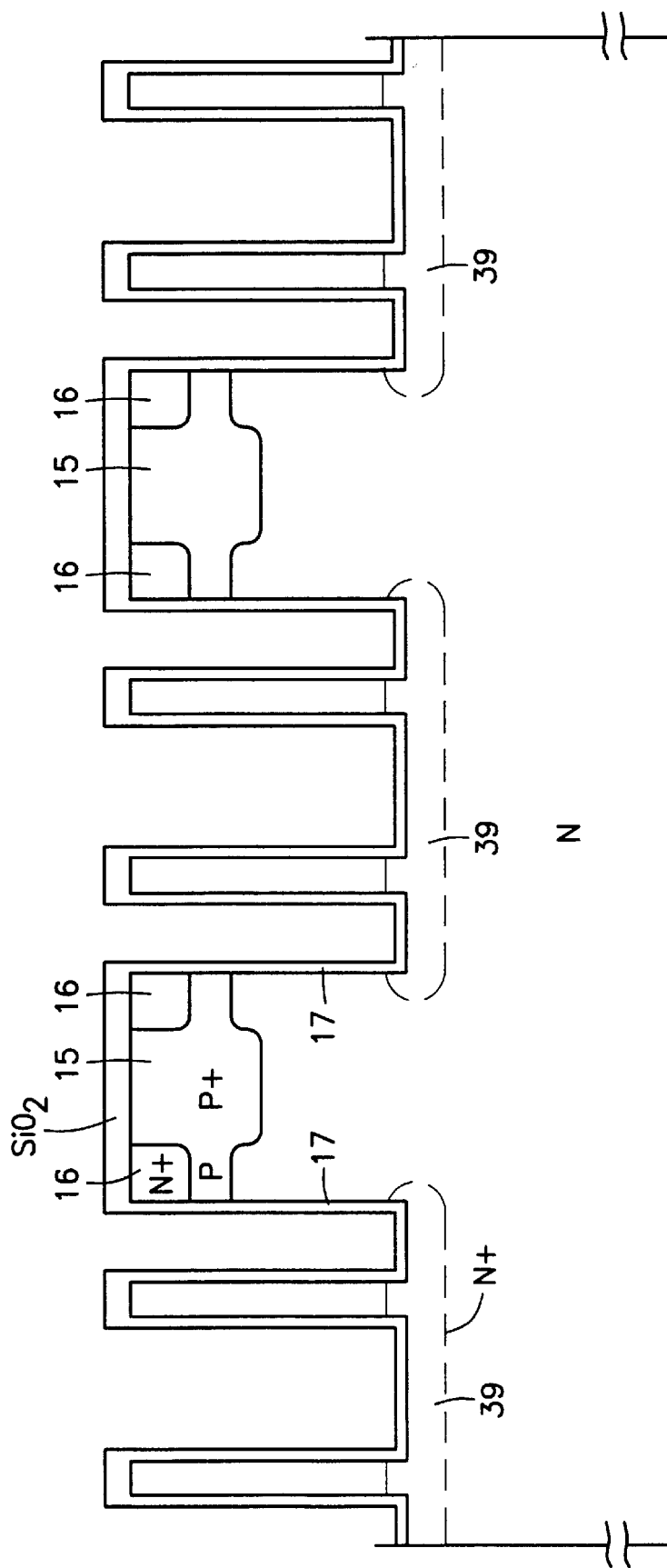
FIGS. 5a–5d illustrate a sequence of process steps forming the DMOS transistor shown in FIG. 4.

The inventive DMOS devices shown in FIGS. 3 and 4 may be fabricated in accordance with conventional processing techniques with the appropriate modification of the deposition and etching steps. For example, the FIG. 4 device begins by forming the bodies 15a and 15b and the source regions 16a–16d in diffusion steps and the gate and drain access trenches in etching steps. Additional details concerning such steps may be found, for example, in previously mentioned U.S. Pat. No. 4,893,160. Next, a dielectric layer 17 such as a silicon dioxide layer is grown in the trenches, followed by the introduction of a diffusing species, e.g., phosphorous, to the bottom of the trenches by a technique such as ion implantation. The diffusing species is then diffused to form the continuous, heavily doped regions 39. FIG. 5a shows the structure at the end of this stage of fabrication.

Figure 5B:
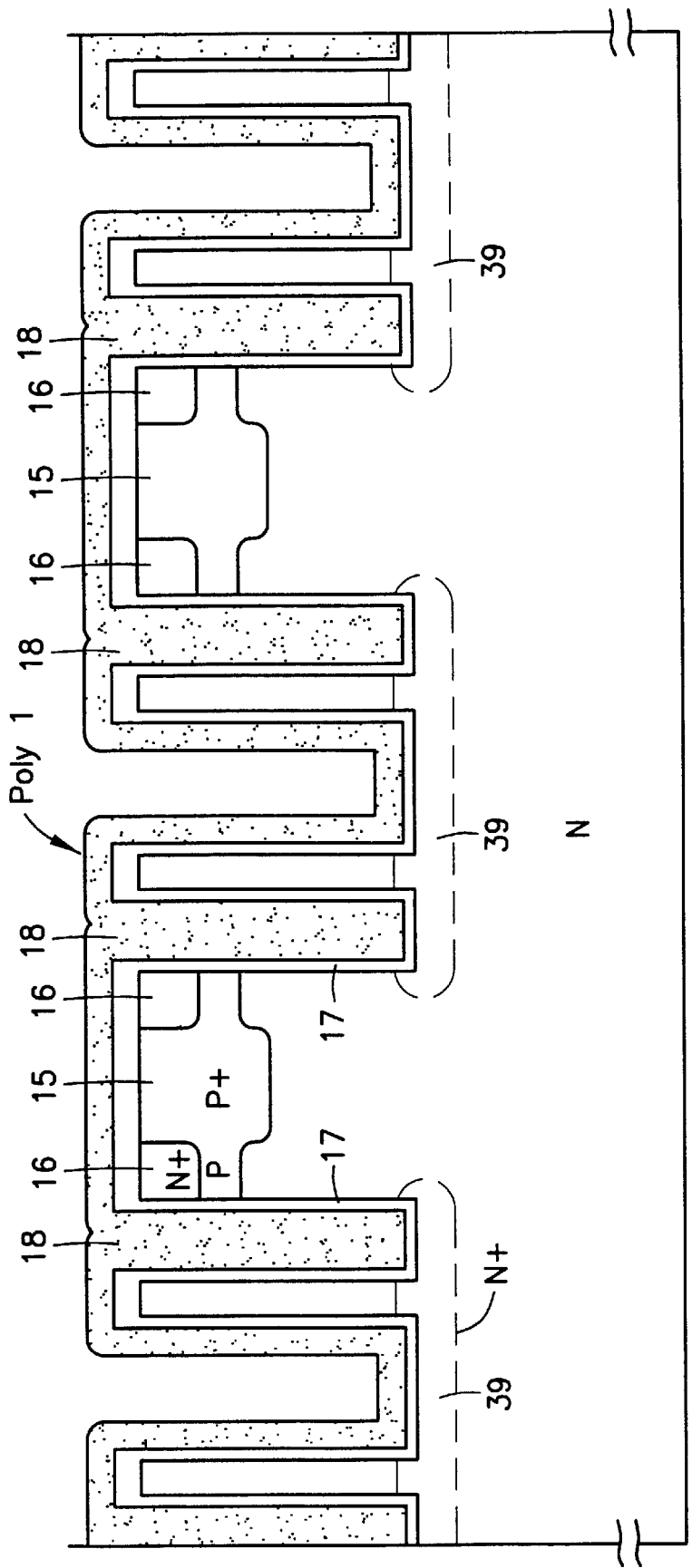
Figure 5C:
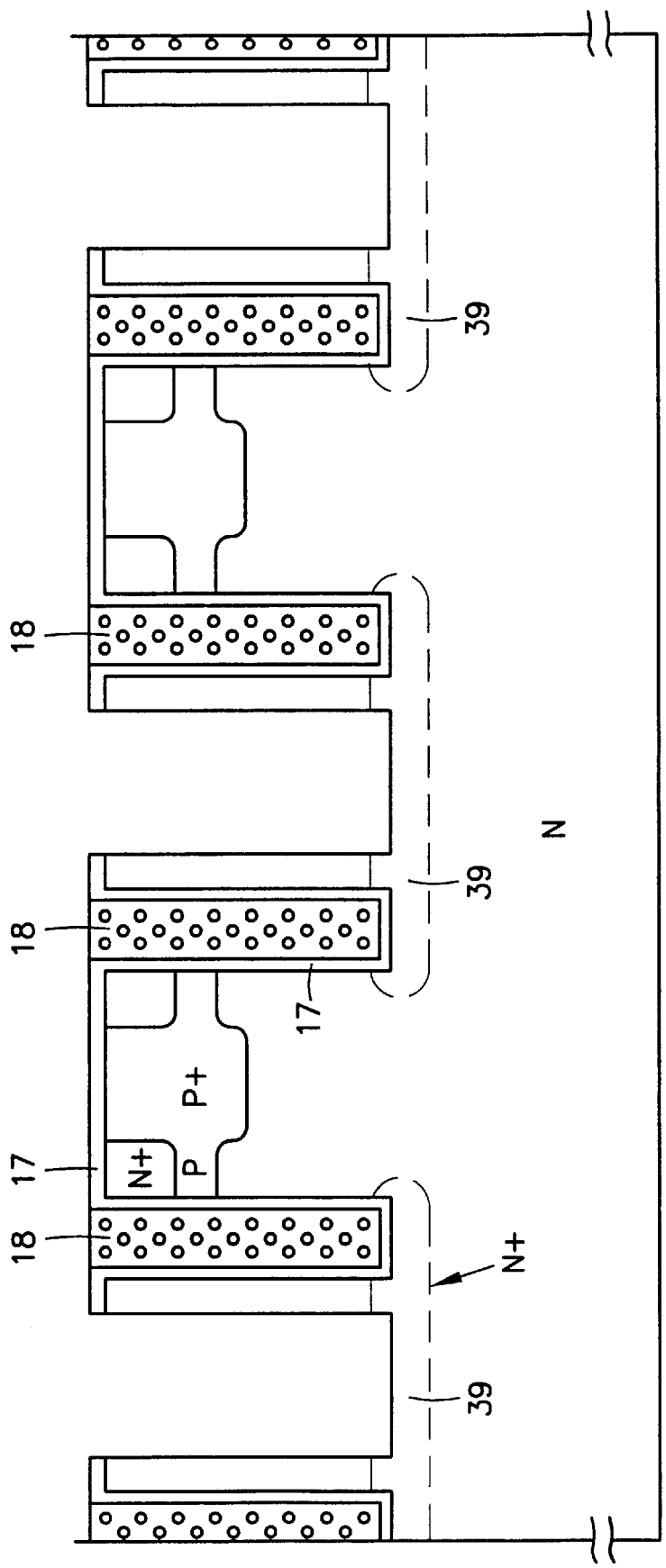
Figure 5D:
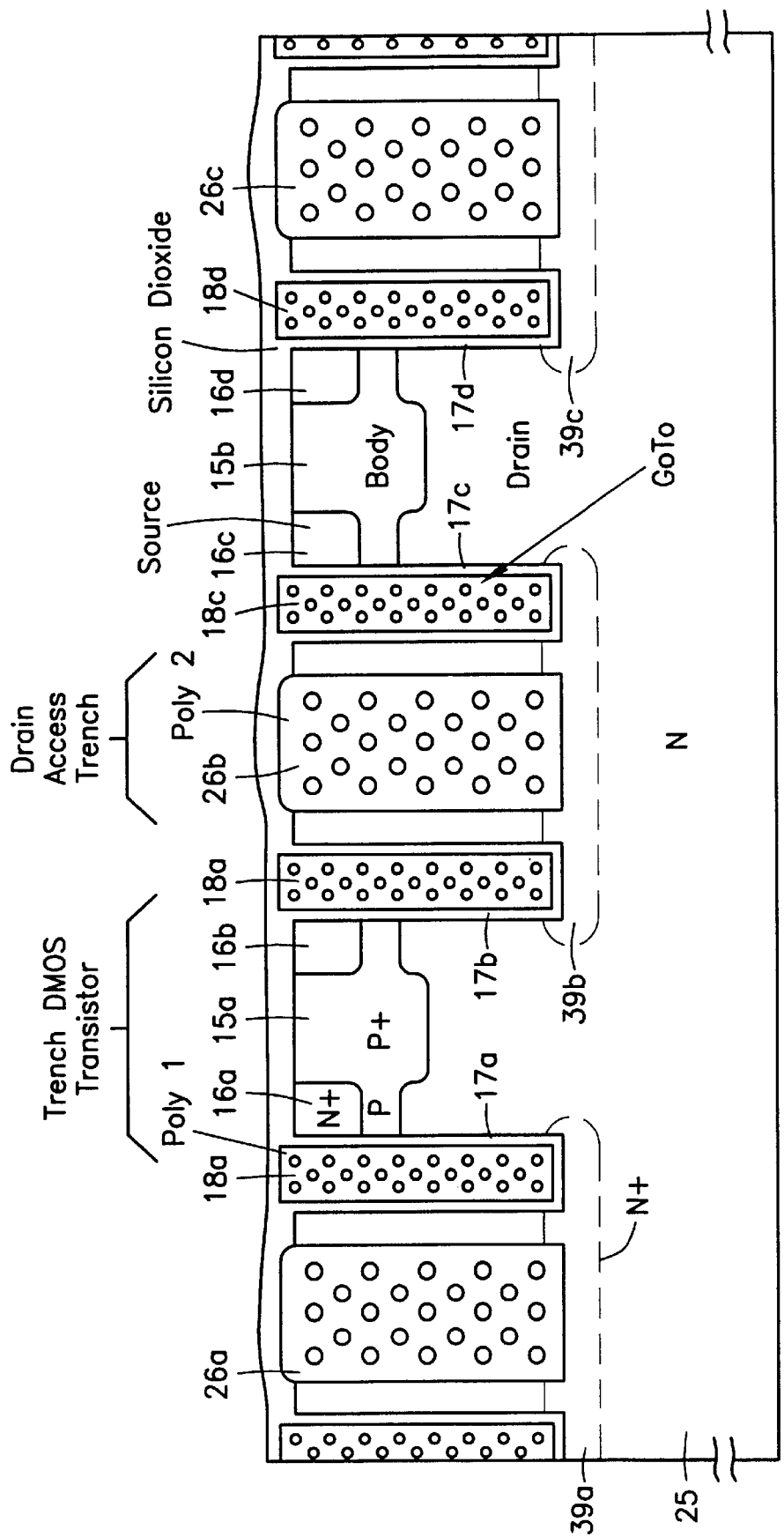

Next, as shown in FIG. 5b, the gate trenches and the drain access trenches are filled with polysilicon. As is well known to those of ordinary skill in the art, polysilicon will more quickly fill a narrow trench of a given depth than a wider trench of the same depth. Accordingly, in some embodiments of the invention such as those shown in the figures, it may be desirable to make the width of the drain access trench greater than the width of the gate trench. In this way, as shown in FIG. 5b, when the gate trench is filled with polysilicon the drain access trench will remain only partially full. In either case, after the gate trench is filled with polysilicon, the polysilicon in the drain access trench is removed in an isotropic etch process. A subsequent etch process is employed to remove the silicon oxide layer lining the drain access trench. Next, as shown in FIG. 5d, the drain access trench is filled with N type doped polysilicon to form the drain access region 26.

Figure 6:
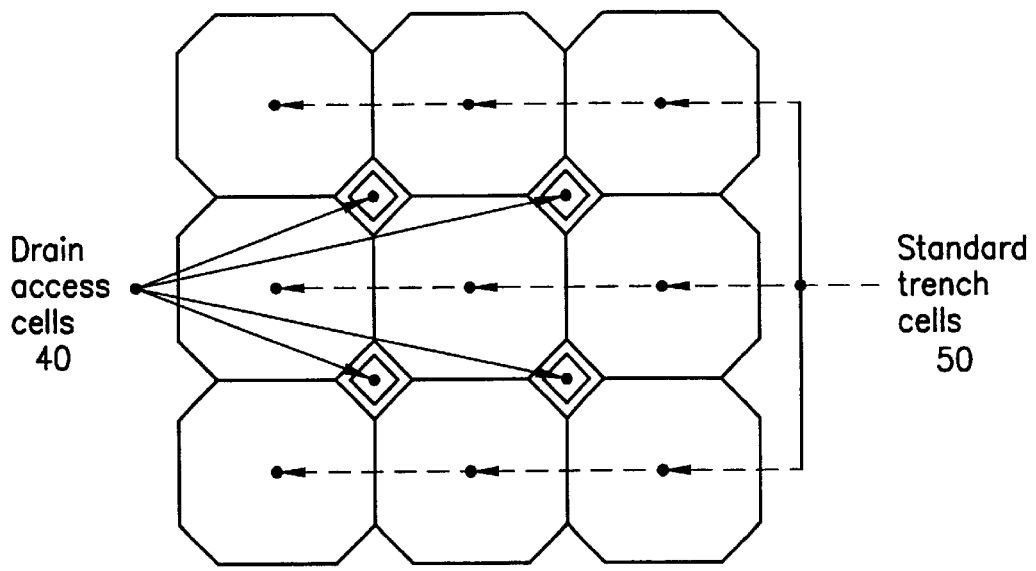
FIGS. 6–8 show top views of various geometries in which a plurality of DMOS transistors constructed in accordance with the present invention may be arranged.
Figure 7:
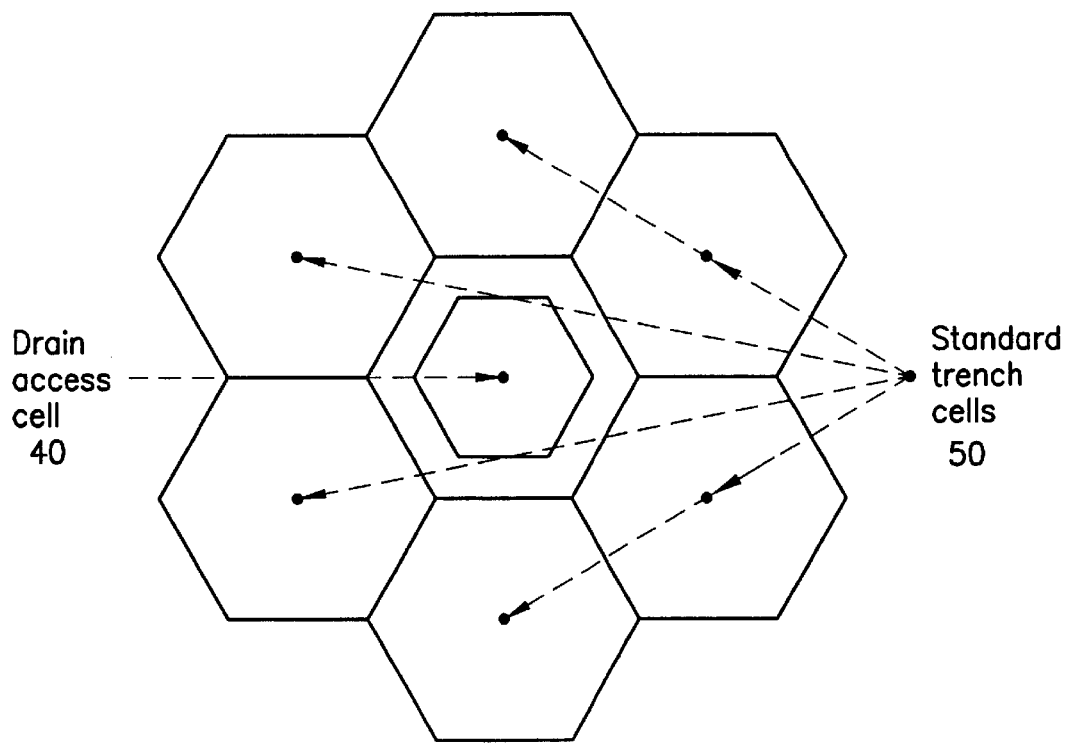
Figure 8:
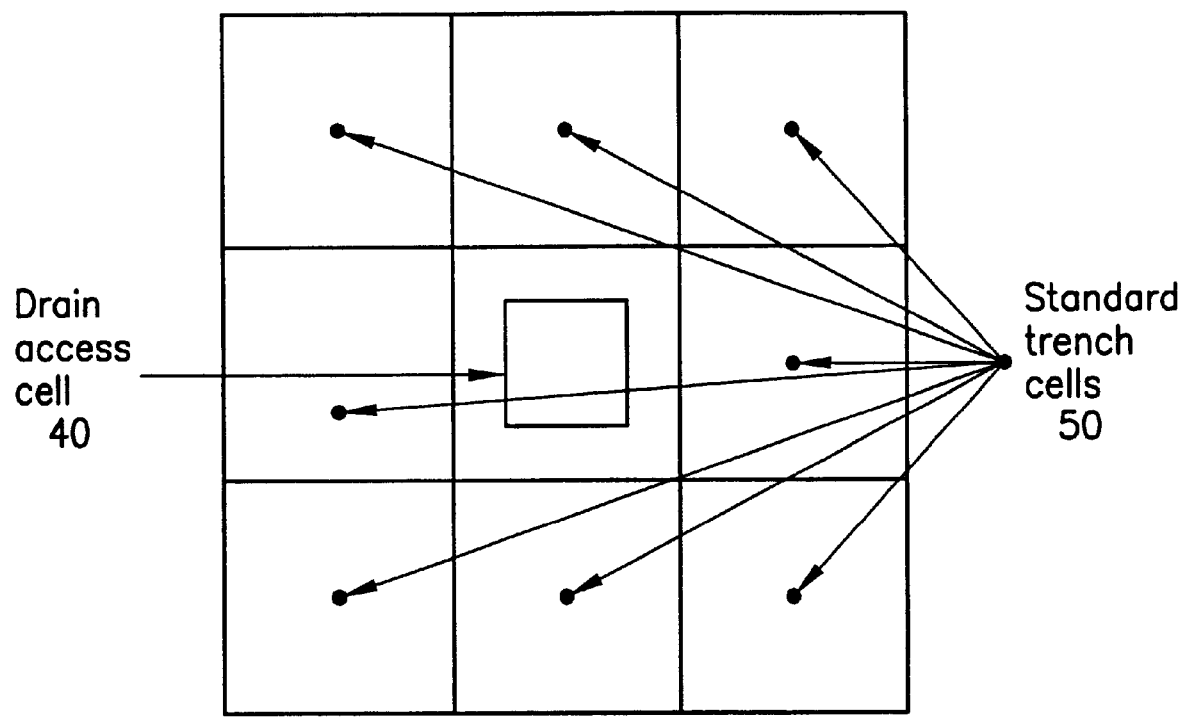

FIGS. 6–8 show top views of various surface geometries in which a plurality of the inventive DMOS transistors may be arranged. The arrangements include drain access cells 40 and transistor cells 50. The drain access cells 40 denote the structure defined by the drain access trench and the adjacent gate trenches which are interconnected by the low resistance path. The transistor cells 50 denote the structure defined by the conventional DMOS transistor structure, which includes the gate trenches, the source regions and the body region. While these or any other geometries may be employed, the octagonal arrangement shown in FIG. 6 is particularly advantageous because it allows the relative areas occupied by the transistor cells and the drain access cells to be adjusted independently of one another so that a minimum device on-resistance can be achieved.

What is claimed is:

1. A method for forming a semiconductor device comprising the steps of:
   providing an article that includes a first region of semiconductor material, doped to a first concentration with a dopant of a first conductivity type, and serving as a drain region;
   etching a gate trench within said first region, said gate trench having sides and a bottom;
   etching a drain access trench within said first region, said drain access trench having sides and a bottom;
   forming a source region on the surface of said first region;
   forming a body region within said first region beneath said source region, said body region having a second conductivity type opposite said first conductivity type;
   depositing a dielectric material that lines said gate trench;
   forming a second region of semiconductor material within said first region, said second region being located adjacent to said gate trench near said bottom of said gate trench and extending adjacent to said drain access trench near said bottom of said drain access trench, said second region being of said first conductivity type and having a higher dopant concentration than said first region;
   depositing a gate electrode within said gate trench; and
   depositing a semiconductor material within said drain access trench, said semiconductor material filling said drain access trench being of said first conductivity type and having a higher dopant concentration than said first region.

2. The method of claim 1 wherein the step of forming the second region of semiconductor material includes the step of diffusing a dopant material of the first conductivity type through the gate trench and the drain access trench.

3. The method of claim 1 wherein the diffusion step is sufficient to ensure an overlap of material that diffuses through the gate trench and the drain access trench so that a continuous path of the first conductivity type is formed.

4. The method of claim 1 wherein said gate electrode is formed of conductive material.

5. The method of claim 4 wherein said conductive material is selected from the group of materials consisting of aluminum, alloys of aluminum, polycrystalline silicon, refractory metals, and combinations of polycrystalline silicon and refractory metals.

6. The method of claim 1 wherein said gate dielectric material is located along said sides and bottom of said gate trench.

7. The method of claim 1 wherein said article includes a semiconductor substrate upon which said first region is located.

8. The method of claim 7 wherein said semiconductor substrate is doped to said first conductivity type.

9. The method of claim 1 wherein said second region is formed beneath said gate trench and said drain access trench and extends above the bottom of said trenches.

10. The method of claim 1 wherein the drain access trench is greater in width than said gate trench.

* * * * *

UNITED STATES PATENT AND TRADEMARK OFFICE
CERTIFICATE OF CORRECTION

PATENT NO.    : 6,432,775 B2
DATED         : August 13, 2002
INVENTOR(S)   : Richard A. Blanchard It is certified that error appears in the above-identified patent and that said Letters Patent is hereby corrected as shown below:

Column 2,
Line 24 (before SUMMARY OF THE INVENTION), insert the following omitted paragraph: -- It would be desirable to provide further improvements to trenched DMOS devices. For example, there is a need or a trenched DMOS device that provides a low on-resistance and which is relatively simple and inexpensive to fabricate. --

Column 3,
Line 3, after "circuits", insert -- . --.
Line 43, change "DMC)S" to -- DMOS --.

Signed and Sealed this

Fifteenth Day of April, 2003

JAMES E. ROGAN
*Director of the United States Patent and Trademark Office*